US007211204B2

(12) United States Patent
Bernards et al.

(10) Patent No.: US 7,211,204 B2
(45) Date of Patent: May 1, 2007

(54) ADDITIVES TO STOP COPPER ATTACK BY ALKALINE ETCHING AGENTS SUCH AS AMMONIA AND MONOETHANOL AMINE (MEA)

(75) Inventors: Roger Francis Bernards, South Haven, MN (US); Beth Ann LaFayette, Minneapolis, MN (US); Thao Pham, Plymouth, MN (US)

(73) Assignee: Electrochemicals, Inc., Maple Plain, MN (US)

( * ) Notice: Subject to any disclaimer, the term of this patent is extended or adjusted under 35 U.S.C. 154(b) by 41 days.

(21) Appl. No.: 10/735,424

(22) Filed: Dec. 12, 2003

(65) Prior Publication Data

US 2005/0126429 A1    Jun. 16, 2005

(51) Int. Cl.
*H01B 1/24* (2006.01)
(52) U.S. Cl. ..................................... 252/511
(58) Field of Classification Search ............. 252/502, 252/506, 511; 106/31.92
See application file for complete search history.

(56) References Cited

U.S. PATENT DOCUMENTS

| 5,061,566 | A | * | 10/1991 | Morgan ................... 428/423.1 |
| 5,139,642 | A | | 8/1992 | Randolph et al. |
| 5,389,270 | A | | 2/1995 | Thorn et al. |
| 5,476,580 | A | | 12/1995 | Thorn et al. |
| 5,690,805 | A | | 11/1997 | Thorn et al. |
| 5,725,807 | A | | 3/1998 | Thorn et al. |
| 6,203,605 | B1 | * | 3/2001 | Thakkar et al. ............. 106/31.6 |
| 6,344,157 | B1 | * | 2/2002 | Cheng et al. ............... 252/512 |
| 6,375,731 | B1 | | 4/2002 | Carano et al. |
| 6,432,320 | B1 | * | 8/2002 | Bonsignore et al. .......... 252/70 |
| 6,440,331 | B1 | | 8/2002 | Carano et al. |
| 6,583,201 | B2 | * | 6/2003 | Cheng et al. ............... 523/457 |
| 6,676,738 | B2 | * | 1/2004 | Sano et al. .............. 106/31.75 |
| 6,730,149 | B2 | * | 5/2004 | Arita et al. .............. 106/31.27 |
| 6,811,821 | B2 | * | 11/2004 | Maxwell et al. ......... 427/376.2 |
| 2004/0054044 | A1 | * | 3/2004 | Bittner et al. ............... 524/261 |
| 2004/0069454 | A1 | * | 4/2004 | Bonsignore et al. ... 165/104.15 |

FOREIGN PATENT DOCUMENTS

WO    WO 02/31222 A2 *   4/2002

* cited by examiner

*Primary Examiner*—Mark Kopec
(74) *Attorney, Agent, or Firm*—McAndrews, Held & Malloy, Ltd.

(57) ABSTRACT

A corrosive composition, such as an alkaline aqueous carbon dispersion, a cleaner, a cleaner conditioner, or a conditioner, comprises a corrosion inhibitor, e.g., benzotriazole. The corrosion inhibitor is present in an amount effective to reduce or stop the dissolution of metal from a metallic surface, such as a printed circuit board, in contact with the composition. A method to reduce or stop the dissolution of metal from a metallic surface in contact with a corrosive composition, and a method to stabilize or recover a corrosive composition containing metal contaminants by adding an effective amount of a corrosion inhibitor to the corrosive composition.

9 Claims, No Drawings

ADDITIVES TO STOP COPPER ATTACK BY ALKALINE ETCHING AGENTS SUCH AS AMMONIA AND MONOETHANOL AMINE (MEA)

RELATED APPLICATIONS

[Not Applicable]

BACKGROUND OF THE INVENTION

The present invention generally relates to a composition comprising a corrosion inhibitor and a method for using the corrosion inhibitor to reduce or stop corrosion of metal from a metallic surface in a corrosive environment. One aspect of the present invention relates more particularly to such a composition and method to reduce or stop corrosion of copper from a circuit board in a solution containing etching agents, such as in a colloidal carbon dispersion, a cleaner, or a conditioner.

In the manufacture of printed circuit boards (PCBs), especially multilayer PCBs, treatment chemicals that can etch copper from the copper surfaces of the circuit boards are employed in several steps. For example, aqueous carbon dispersions or electroless metal deposition baths are used to provide a conductive coating on through holes, via walls and other initially nonconductive surfaces of PCBs. ("Through holes" are holes drilled through double-sided or multilayer circuit boards to complete circuits between the circuit patterns. A "via" as used herein refers either to a through hole or to an open or blind recess, however formed. Vias and through holes can be formed by drilling, by laser or plasma ablation, additively (as by using a photoresist), or in any other way presently known or discovered in the future.) Also, both before and after the PCBs are coated with the aqueous carbon dispersions or electroless metal deposition baths, the PCBs are often treated with cleaners, or conditioners. These aqueous carbon dispersions, cleaners and conditioners commonly contain copper etching agents such as ammonia and monoethanolamine (MEA) that will dissolve copper from the circuit boards into the solution.

Information about such aqueous carbon dispersions, cleaners, conditioners, electroplating baths, and methods for using them, can be found in U.S. Pat. Nos. 5,476,580, 5,389,270, 5,690,805, and 5,725,807 issued to Thorn et al. and U.S. Pat. Nos. 6,375,731 and 6,440,331 issued to Carano, et al. The patents referred to in the preceding sentence are incorporated herein by reference in their entireties. Graphite compositions, cleaners, conditioners, and other materials and directions needed to practice these patents are available under the trademark Shadow® from Electrochemicals Inc., Maple Plain, Minn. Other carbon dispersions containing carbon black, cleaners and conditioners are described, for example, in U.S. Pat. No. 5,139,642, and are available under the trademark Blackhole® from Olin Hunt Specialty Products, Inc. of West Paterson, N.J. This specification may refer to a Shadow® graphite bath or a Blackhole® carbon black bath, while referring to other solutions containing etching agents generally as cleaners, conditioners, electroplating bathes, etc.

A problem with the current manufacture of PCBs is that a Shadow® graphite bath (or a Blackhole® carbon black bath) dissolves copper from the circuit boards contacted by the bath. Because a Shadow® graphite bath is alkaline, it can also react with carbon dioxide ($CO_2$) from the air to form copper carbonate. The copper, copper carbonate or carbonate dissolved in a Shadow® graphite bath causes the bath to form gels. Gel formation leads to a diminished bath life. Cleaners and conditioners can cause similar problems because they also have alkaline etching agents (e.g. MEA) in them and are corrosive solutions. Most cleaners and conditioners used in the PCB industry are dumped on the basis of how much copper is in them.

In other words, in the prior art, copper metal on the circuit boards is attacked by ammonia in the Shadow® graphite solution, or by MEA or other acids or bases in the cleaners or conditioners. The bath becomes ineffective, and then must be disposed of, when it is fouled with excess copper, and new baths are made. This will not only increase manufacturing cost but also raise an environmental issue. Solutions contaminated with copper must be treated before being disposed, and this will certainly incur waste treatment cost.

In the prior art, after the metallic surface of a circuit board is corroded in a cleaner, a conditioner or a Shadow® graphite bath, one would apply a corrosion inhibitor such as benzotriazole (BTA) or tolytriazole (TTA) to the board, and then leave the circuit board in air, tap water, or some other non-corrosive environment, so the metallic surface of the board will not tarnish. One way of doing this is to employ BTA, TTA or mixtures of both in a relatively non-corrosive solution such as water or only mildly acidic water, and apply this solution to the copper surface after it has been treated in a cleaner, a conditioner or a graphite bath and after corrosion has happened. The purpose of this solution is to impart corrosive inhibition to the copper surface after drying. This use of a corrosion inhibitor in prior art is to stop tarnish from forming on the surface of "dry" copper exposed to air while boards are waiting for the next process step. But such use of corrosion inhibitors does not prevent corrosion from happening inside a corrosive environment in the first place. And this use does not prolong the life of a cleaner, a conditioner or a graphite bath.

BRIEF SUMMARY OF THE INVENTION

An object of the present invention is to reduce the degree or rate of corrosion of copper surfaces by a colloidal carbon bath.

Another object of the present invention is to prevent MEA or other bases or acids from etching copper from PCBs immersed in cleaners and conditioners.

An additional object of the present invention is to reverse gel formation caused or accelerated by the uptake of copper into an aqueous carbon dispersion.

Other objects of the invention will become apparent to one skilled in the art who has the benefit of this specification and the prior art.

It is surprisingly found in the present invention that adding a corrosion inhibitor directly to an alkaline dispersion, such as an aqueous carbon dispersion, a cleaner, or a conditioner, can reduce or stop the attack of a metal surface immersed in the dispersion and increase the bath life. Put in other words, by adding an effective amount of corrosion inhibitor in a corrosive composition, corrosion inhibition is occurring in situ in an otherwise extremely corrosive environment for metal dissolution. It is further found that such additives can unexpectedly reverse the gelled state of a dispersion even after corrosion and/or gel formation have occurred.

In a first aspect, the present invention provides a composition including from about 0.1 to about 25% by weight of electrically conductive carbon and a corrosion inhibitor in an amount effective to reduce the dissolution of metal from a metallic surface in contact with the composition. The metallic surface can be, for example, a PCB with copper traces or cladding. The electronically conductive carbon may be carbon black, graphite, or a combination of them. Depending on the amount present in the composition, the corrosion inhibitor can either reduce or totally stop the corrosion of metal from a the metallic surface immersed in the composition.

The amount of a corrosion inhibitor in the composition can be from about 1 ppm to about 10,000 ppm (1% by weight), alternatively from about 50 ppm to about 4000 ppm, alternatively from 200 ppm to 600 ppm. The corrosion inhibitor can be a compound or a mixture of compounds selected from an imidazole, a triazole, an indole, an azole, a thiazole, or a tetrazole. An example of such a corrosion inhibitor is BTA. Other examples of inhibitors are tolyltriazole (TTA), 3-amino-1,2,3-triazole, sodium mercaptobenzothiazole (Na MBT) and thiourea.

The claimed composition may further contain 0.01 to 10% by weight of a water dispersible binding agent selected from the group consisting of monosaccharides, polysaccharides, and combinations thereof. Monosaccharide binding agents contemplated for use herein include tetroses, pentoses, and hexoses. Polysaccharide (which for the present purposes includes disaccharide and higher saccharide) binding agents contemplated for use herein include sucrose (from beets, sugarcane, or other sources), maltose, fructose, lactose, stachyose, maltopentose, dextrin, cellulose, corn starch, other starches, and polysaccharide gums. Polysaccharide gums contemplated for use herein include agar, arabic, xanthan (for example, KELZAN industrial grade xanthan gum, available from the Kelco Div. of Merck & Co, Inc. of Rahway, N.J.), pectin, alginate, tragacanath, dextran, and other gums. Derivative polysaccharides contemplated for use herein include cellulose acetates, cellulose nitrates, methylcellulose, and carboxymethylcellulose. Hemi-cellulose polysacharides contemplated for use herein include d-gluco-d-mannans, d-galacto-d-gluco-d-mannans, and others.

In a second aspect, the present invention provides a composition including a conditioning agent, a cleaning ingredient, or a combination of both, and a corrosion inhibitor in an amount effective to reduce or stop the dissolution of metal from a metallic surface in contact with the composition. The cationic conditioning agent or cleaning ingredient can be an active component of a cleaner and/or conditioner. The composition may further include a binding agent and/or an anionic dispersing agent, which are commonly seen in cleaners and conditioners. Depending on the user's need, the type of cleaner or conditioner and the specific kind of corrosion inhibitor used, the amount of inhibitor in the composition may vary. In one embodiment, the concentration of the inhibitor is from about 1 ppm to about 10,000 ppm (1% by weight), alternatively from about 50 ppm to about 4000 ppm, alternatively from 200 ppm to 600 ppm. The inhibitor can be any of the inhibitors defined above.

In another aspect, the invention provides a method to reduce the dissolution of metal from a metallic surface in a corrosive composition, including adding an effective amount of a corrosion inhibitor to the composition, and then applying the composition to the metallic surface. The metallic surface, for example, can be part of a PCB with copper traces or cladding, and the corrosive composition can be, for example, a colloidal carbon dispersion, a cleaner, a conditioner or an electroplating bath. The amount and type of the corrosion inhibitor to be added can be as described above.

Still another aspect of the invention provides a method to stabilize or recover a corrosive composition, including the steps of:

(1) presenting a metallic surface to the corrosive composition under conditions effective to dissolve metal from the metallic surface;

(2) dissolving metal from the metallic surface in the corrosive composition; and (3) adding a corrosion inhibitor to the corrosive composition in an amount effective to stabilize or recover the corrosive composition.

The corrosion inhibitor can be added to the corrosive composition containing metal contaminants to prevent gel formation. The corrosion inhibitor can also be added after gel formation has occurred in an amount effective to at least partially reverse the gel formation.

In an embodiment of this aspect of the invention, the corrosive composition is a carbon dispersion, such as a graphite and/or carbon black dispersion, and the metallic surface is a copper surface of a PCB. After a period of use, the carbon dispersion with no corrosion inhibitor becomes gelled as contaminant (such as copper) content increases. Depending on his/her needs, a user can apply about 1 ppm to about 10,000 ppm (1% by weight) of a corrosion inhibitor, such as BTA, to the carbon dispersion to at least partially reverse the gelled state of the carbon dispersion.

BRIEF DESCRIPTION OF SEVERAL VIEWS OF THE DRAWINGS

[Not Applicable]

DETAILED DESCRIPTION OF THE INVENTION

While the invention will be described in connection with one or more preferred embodiments, it will be understood that the invention is not limited to those embodiments. On the contrary, the invention includes all alternatives, modifications, and equivalents as may be included within the spirit and scope of the appended claims.

In one aspect, the present invention is directed to a corrosion inhibitor that can be added directly as an extra ingredient to PCB fabrication chemicals such as aqueous carbon dispersions, cleaning compositions and conditioning compositions and can work effectively inside an otherwise extremely corrosive environment for metal dissolution. These compositions, without the corrosion inhibitor in them, are known, commercially available, and are described in numerous publications, including U.S. Pat. Nos. 5,139,642, 5,389,270, 5,476,580, 5,690,805, 5,725,807, 6,375,731 and 6,440,331 that are all incorporated herein by reference.

PCBs (also known as printed wiring boards or PWBs) are generally laminated assemblies of two or more plates or foils of conductive material (commonly copper or copper plated with solder or a precious metal such as gold), which are separated from each other by a layer of non-conducting material including epoxy glass, polyimide, PTFE and cyanate ester. Although copper is generally used as the conductive metal in PCBs, those skilled in the art will recognize that other metals such as nickel, gold, palladium, silver and the like can also be used as conductive layers on PCBs.

To make electrical connections between the circuit patterns of a double-sided or multi-layer board, through holes are first drilled at desired locations of a PCB through the laminate of copper plates and the nonconducting layer(s). After drilling through holes, the holes usually are deburred and cleaned, and the PCB is subject to a precleaning process to place it in condition for receiving the liquid carbon dispersion. During this precleaning process, a cleaner and conditioner composition is usually used.

Cleaners and conditioners normally are alkaline aqueous solutions comprising a base. The base can be a lower alkanol amine (lower alkanol being defined as 1- to 4-carbon alcohol moieties), such as an ethanolamine, for example mono-, di- or triethanolamine; an alkali material generally, such as an alkali metal hydroxide, carbonate, or bicarbonate, for example potassium hydroxide, carbonate, or bicarbonate; any other material capable of raising the pH of the composition, preferably to at least about 9; and mixtures of such materials.

The base, without the presence of a corrosion inhibitor as taught by the present invention, can etch copper from PCBs. Virtually every cleaner, cleaner conditioner, or conditioner used in the PCB industry dissolves copper metal from the PCBs. Copper concentration increases as the baths are used. One can walk into virtually any PCB shop and see cleaner baths that are blue or green because the cleaner solution is very corrosive towards copper and copper metal has dissolved in it during the useful operation of the cleaner. Once a certain copper concentration is reached in the baths, they are discarded and new baths have to be made because copper contamination decreases their effectiveness.

A cleaner may further comprise a cleaning ingredient, such as a cationic or nonionic surfactant. A conditioner may further comprise a conditioning agent, which is a substantive material, commonly a cationic material such as a polyamidoamine, a cationic polymer, a cationic surfactant, or the like (e.g., SANDOLEC CF catonic polyelectrolyte). Beyond the usual conditioning ingredients, the conditioner may include one or more of the following: a binding agent, a pH buffer, a dispersing agent, and combinations thereof.

Conductive carbon aqueous dispersions are next applied to or contacted with the conditioned PCBs to provide a conductive coating on through holes, via walls or other nonconductive surfaces of the PCBs. An active component of a conductive composition is conductive carbon, for example, carbon black, graphite, or a combination of the two. The electrically conductive carbon particles should be present in an amount effective to provide an electrically conductive coating when the composition is applied to a substrate. The carbon may be present at from about 0.1 to about 25% by weight, alternatively from about 0.1 to about 20% by weight, alternatively from about 0.5 to about 10% by weight, alternatively from about 1 to about 7% by weight, alternatively from about 3 to about 6.5% by weight of the composition. The methods of contacting the dispersion to the PCB include immersion, spraying, and other methods of contacting chemicals used in the PCB industry.

An aqueous carbon dispersion, e.g., a Shadow® graphite bath or a Blackhole® carbon black bath, is usually alkaline with a pH range of from about 9 to about 11. Such a dispersion, without the presence of a corrosion inhibitor as taught by this invention, dissolves copper from PCBs when it is applied to the PCBs. A Shadow® graphite bath is a colloid, and any increase in the ionic strength or solution conductivity can destroy the colloid and cause gel formation. The dissolved copper from the PCBs and the dissolved carbon dioxide ($CO_2$) from the air will increase the ionic strength and conductivity of the dispersion.

Gel formation starts to occur when the amount of dissolved copper reaches a certain level in the dispersion (e.g., 500 ppm). The gels that form are mostly made up of the colloidal graphite particles themselves with copper amongst it. Even though graphite or carbon black dispersions can gel up from a multitude of contaminants, copper is one of the primary contaminants as that is what is being submersed into the dispersions. A Shadow® graphite bath is no longer useful when it reaches a certain viscosity and a certain ionic contamination level.

After a PCB is treated with an aqueous carbon dispersion and ready for electroplating, the PCB is immersed in a suitable electroplating bath for applying a copper coating on the hole walls of the nonconducting layer(s). A typical copper electroplating bath uses copper sulfate as the source of cupric ions. Other electroplating bath compositions containing other copper salts or other metal salts such as salts of nickel, gold, palladium, silver, and the like may also be employed.

The PCB is removed from the copper electroplating bath and then washed and dried to provide a board which is further processed. For example, the PCB may be subjected to a tin-lead electroplating operation. The present invention contemplates the use of any and all treatment chemicals conventionally employed in the manufacture of PCBs. Therefore, this claimed invention should not be limited to any particular cleaner, conditioner, carbon dispersion, electroplating bath or other treatment chemical parameters.

The corrosion inhibitor of the present invention may be any corrosion inhibitor that can reduce or stop the corrosion of metals including copper. One such corrosion inhibitor is a compound or a mixture of compounds containing 5 or 6 membered aromatic N heterocycles and especially 5 or 6 membered fused aromatic N heterocycles. For example it can be an imidazole, a triazole, an indole, an azole, a thiazole, a tetrazole, or a mixture of them. Examples of suitable corrosion inhibitors are benzotriazole (BTA), tolyltriazole (5-methylbenzotriazole, TTA), sodium mercaptobenzothiazole (Na MBT), 3-amino-1,2,3-triazole, thiourea, 1,2,3-benzotriazin-4(3H)-one, benzotriazole-5-carboxylic acid, benzotriazole-1-methanol, and other BTA derivatives.

One contemplated compound is BTA, which is a widely known corrosion inhibitor. BTA is not very soluble in distilled water, so preferably a composition using the present invention includes solvents, ammonia, ammonium hydroxide, or other compounds that can help to dissolve the BTA in water.

In accordance with an embodiment of the present invention, the above mentioned cleaner or conditioner can also include a corrosion inhibitor. Depending on the concentration of the cleaner or conditioner (i.e., diluted or concentrated), the need of the user, and the type of corrosion inhibitor used, the amount of the corrosion inhibitor present in the cleaner or conditioner composition may vary in a wide range. Therefore, some routine experimentation may be needed to optimize the concentration of the inhibitor in a cleaner or conditioner (or in another composition using the present invention). A typical concentration is within the range of from about 1 ppm to about 1% based on the total weight of the cleaner or conditioner solution, alternatively from about 50 ppm to about 4000 ppm, alternatively from about 200 ppm to about 600 ppm. With about 500 ppm of BTA in a typical cleaner or conditioner bath, almost no copper is dissolved from a PCB immersed in it.

In another embodiment of the present invention, the above mentioned aqueous carbon dispersion further comprises a corrosion inhibitor. When the dispersion is a colloid, a nonionic corrosion inhibitor is preferred because an ionic inhibitor would undesirably increase the conductivity or ionic strength of the bath. Ionic contamination is known to be effective at flocculating (destroying) hydrophobic colloids like aqueous carbon based dispersions and other dispersions and cause gel formation. Nonionic corrosion inhibitors such as those having 5 or 6 membered aromatic N heterocycles and especially 5 or 6 membered fused aromatic N heterocycles do not cause ionic contamination themselves. A good example of a nonionic corrosion inhibitor is BTA or TTA.

Similar to a cleaner or conditioner composition, the amount of the corrosion inhibitor in the aqueous carbon dispersion may vary in a wide range. A typical amount is from 1 ppm to 10,000 ppm (1% by weight), alternatively from about 50 ppm to about 4000 ppm, alternatively from about 200 ppm to about 600 ppm. It was found that in a Shadow® graphite bath using BTA, at a 200 ppm level, a significant reduction in the copper dissolution rate was perceived. At a 300–400 ppm level, almost no copper was dissolved into the Shadow® graphite bath from the PCBs immersed in it.

Although rinsing, drying, other cleaning and conditioning, adhesion promotion, fixing, additional conductive carbon treatment and microteaching steps are not mentioned above, it is within the scope of the present invention to add a corrosion inhibitor to a composition used in any of such steps and other useful steps in the PCB industry, as long as the composition is contacted with the circuit board while the circuit board is in an otherwise corrosive bath.

The present invention further provides a method to reduce the dissolution of metal from a metallic surface in a corrosive composition, such as a cleaner, a cleaner conditioner, a conditioner, or a carbon dispersion. For example, a user or maker of a cleaner, a conditioner, or an aqueous carbon dispersion can add an effective amount of a corrosion inhibitor to the composition, which can then be applied to a circuit board. Some routine experimentation may be needed for the user or maker to optimize the amount of the inhibitor to be added to the composition. But by adding a corrosion inhibitor to the corrosive composition, metal corrosion can be reduced or stopped even inside an otherwise extremely corrosive environment. In accordance with an embodiment of the invention, a typically amount of corrosion inhibitor needed is from about 1 ppm to about 1% by weight, alternatively from about alternatively from about 50 ppm to about 4000 ppm, alternatively from about 200 ppm to about 600 ppm.

Some corrosion inhibitors, like BTA, TTA or others with 5 or 6 membered aromatic N heterocycles and especially 5 or 6 membered fused aromatic N heterocycles, can act as stabilizers to a corrosive composition containing copper or other metal contaminants. One contemplated mechanism of stabilization is that certain corrosion inhibitors can complex the copper or other metal contaminants in the composition. Therefore, the present invention can also be used to stabilize or recover a corrosive composition that has gelled up after dissolving metal from a metallic surface contacting it.

In one embodiment of the present invention, the corrosive composition is an aqueous carbon dispersion which slowly etches copper from the circuit boards treated by it. After the bath is run for a period of time, it contains too much copper, and gels are formed in the bath due to contamination from ions. In the prior art, a manufacturer of PCBs would find it necessary to dump the bath. In accordance with the present invention, however, the manufacturer can add a corrosion inhibitor to the corrosive composition in a sufficient amount to reverse the gel formation.

The amount of the corrosion inhibitor used should be effective to at least partially reverse the gel formed in the bath. When BTA is used, a typical amount is from about 1 ppm to about 1% by weight, alternatively from about 50 ppm to about 4000 ppm, alternatively from about 100 ppm to about 600 ppm. At 50 ppm level, BTA is capable of reversing gel formation occurred in a Shadow® graphite bath, and at around 100 to 200 ppm level, BTA will revitalize the bath.

This invention can be used to treat any corrosive composition any time before or after etching has occurred. When the corrosion inhibitor is added before the corrosive composition contacts a metallic surface, it serves as a corrosion inhibitor. When the corrosion inhibitor is added after corrosion has happened, the corrosion inhibitor serves dual purpose as a stabilizer (and a gel formation reversal agent or dispersion recovery agent) and a corrosion inhibitor. But a user does not need to wait until gel has formed, and its use is not limited to corrosive compositions that will gel up when dissolved metal is present. However, the gel formation reversing method of the present invention is especially useful when gel formation has already occurred. With the teaching of the present invention, a user can add an effective amount of a corrosion inhibitor (e.g., BTA or TTA) to the gelled carbon bath. The gels will go away, and the bath's life is prolonged.

The invention will be better understood by reference to the following examples. These examples are provided to describe specific embodiments of the invention and to demonstrate how it works. By providing those specific examples, the inventors do not limit the scope of the invention. The full scope of the invention is all the subject matter defined by the claims concluding this specification, and equivalents thereof.

EXAMPLE 1

Preliminary Comparison Tests of Identical Corrosive Solutions with and without BTA Five 1"×3" (2.5 cm by 7.6 cm) copper laminate pieces were immersed into 250 ml of each of the following solutions with stirring:
(1) 40 mN $NH_3$ solution (conductivity=0.26 mS/cm);
(2) 40 mN $NH_3$ and NaCl solution (conductivity=1.6 mS/cm);
(3) 40 mN $NH_3$ and NaCl solution (conductivity=1.6 mS/cm)+1 g/L BTA (benzotriazole);
(4) Shadow® 2, 4% graphite bath (control);
(5) Shadow® 2, 4% graphite bath+1 g/L BTA Results are compared in the following table which clearly shows the effect of BTA as a corrosion inhibitor.

| Solutions | Results |
|---|---|
| 1 | Insoluble blue crystals formed on the copper surface of the board. Copper was attacked but the complex formed was insoluble. |
| 2 | Copper was dissolved from the board and the solution turned blue. But the next morning the solution became less blue and a reddish brown precipitate (apparently copper) clung to the sides of the beaker. |
| 3 | Copper was not attacked, and the solution stayed totally clear even overnight. |
| 4 | Titrated after 4 hours, 292 ppm Cu was in the solution. |
| 5 | Titrated after 4 hours, only 65 ppm Cu was in the solution. |

The results show that BTA can be directly added to an otherwise corrosive composition containing ammonia and is capable of stopping or greatly reducing the copper attack by such a composition.

EXAMPLE 2

Determining the Effective Amount of BTA

Different amounts of BTA were added to fresh Shadow® graphite baths. Five 1"×3" (2.5 cm by 7.6 cm) copper laminate pieces were immersed into each of the baths for 3 hours, then they were removed and all the Shadow® solution on the laminate pieces was rubbed off. The pieces were etched in fresh persulfate (low BTA to high BTA order), then they were returned to their respective beakers and left overnight. The next morning the Cu was titrated. The results are shown in the following table:

| BTA Concentration (ppm) | Cu overnight (ppm) |
|---|---|
| 0 | 552 |
| 0 | 508 |
| 1 | 444 |
| 2 | 317 |
| 5 | 393 |
| 20 | 361 |
| 100 | 273 |
| 200 | 190 |

The results show that BTA has a favorable effect at and above the 1 ppm level and starts to be very effective at a 200 ppm level to reduce the copper attack by the ammonia in the Shadow® graphite solutions.

EXAMPLE 3

Study of Other Potential Corrosion Inhibitors 500 ppm of the following chemicals were added to different fresh Shadow® graphite baths, and three 1.5"×3" (3.8 cm by 7.6 cm) copper laminate pieces were immersed into each bath with stirring. After 24 hours, the Cu was titrated, and the results are shown in the following table.

| Shadow® Graphite Baths | Chemicals Added | Cu Amount (ppm) |
|---|---|---|
| Control A | No chemical added | 279 |
| Control B | No chemical added | 222 |
| C | Formaldehyde | 280 |
| D | Sodium MBT (Na MBT) | 88 |
| E | Thiourea (626 ppm was added) | 82 |
| F | 3-amino-1,2,4-triazole | 200 |
| G | Quadrol | 254 |
| H | Tolytriazole | 209 |

The results show that both Na MBT and Thiourea are very effective in the proportions used, and are capable of stopping or greatly reducing the copper attack by the ammonia in the Shadow® solutions. Tolyltriazole and 3-amino-1,2,4-triazole also showed some activity in the proportions used.

EXAMPLE 4

Cleaner and Conditioner III 1 g/L of BTA was added to 20% Cleaner/Conditioner III ("CCIII®", available from Electrochemicals Inc., Maple Plain, Minn.) and 1 g/L of copper metal powder was added. Even after stirring for several days, no copper powder was dissolved into the solution. A blank solution without BTA turned deep blue within one day and all of the copper was dissolved. The result shows that BTA is capable of stopping or greatly reducing the copper attack by MEA in the CCIII®. Furthermore, the BTA did not itself cause any harm to the usefulness of the solution.

EXAMPLE 5

Comparison of BTA and Butoxyne 497

The objective of this study is to compare BTA to Butoxyne® 497, a corrosion inhibitor comprising hydroxyethyl ethers of butynediol (available from International Specialty Products, Wayne, N.J.) for effectiveness at stopping copper corrosion in Shadow® graphite baths and their general improvement or degradation of the colloid as compared to controls. Four 1.5" (3.8 cm) by 3" (7.6 cm) copper pieces were submerged into each of the four 250 ml of 4% Shadow® solutions for five days. The copper in each solution was titrated and the results are shown in the following table.

| Shadow® Baths | Results/Cu Amount (ppm) | Notes and Observations |
|---|---|---|
| Control 1 | 762 | Here there was a lot of sludge on the copper pieces but the sludge was not rubbed off into the solution. |
| With 500 ppm BTA | 190 | Here there was no sludge on the copper pieces at all and there was nothing to rub off. |
| Control 2 | 968 | Here there was a lot of sludge on the copper pieces and the sludge was rubbed off into the solution. |
| With 500 ppm Butoxyne 497 | 857 | Here there was a lot of sludge on the copper pieces and the sludge was rubbed off into the solution. |

The quality of dispersion of these different Shadow® baths were also determined. A Shadow® solution is a colloidal suspension of graphite in water. Fresh Shadow® colloids are finely dispersed, however over time Shadow® colloids may gel up and become more viscous. Described below are the procedures followed to determine the "degree of gelling" in a used or old Shadow® solution:

(1) Using a disposable pipette draw up 1 ml of Shadow® solution into the tube. Invert the tube and suck the solution all of the way into the bulb portion of the disposable pipette.

(2) Place a glass slide on a backlight microscope or camera system that can view at about 100 to 200×.

(3) Shake the pipette to stir the solution just before dispensing, and then carefully place less than one drop (20–30 µL) of Shadow® solution onto the center of the glass slide by touching the tip of the disposable pipette to the glass slide and dispensing about ½ of a centimeter in diameter of solution onto the glass slide.

(4) Very carefully place another glass slide on top of the glass slide. Be certain not to chafe or rub the two glass slides together, and do not touch or try to align the two glass slides after placing the top slide on, as even a small amount of rubbing or chafing together of the glass slides will break up a "bad" colloid and make it appear better than it really is.

(5) View the Shadow® solution at 100× using a backlight procedure. The Shadow® dispersion quality cannot be seen by a front light procedure at all. Place a bright light (fiber optic goose-neck light) underneath the sample and view as in a backlight for electroless copper.

(6) If the colloidal suspension looks less than perfect right away, wait a few minutes and observe to see if more gels start to form over time. A perfectly good dispersion will not show any gelling even after several minutes. A bad dispersion will show lots of gels (and much brighter light coming through between these gels) than a good dispersion. A medium quality dispersion will not show gels at the start but will begin to gel up after one or three minutes of being subjected to the strong backlight fiber optic light.

Dispersion quality (Q) is denoted by an arbitrary scale of 0 to 10 based on the pictures of colloids at various states, where 10 represents a perfect dispersion with no gels and 0 represents a Shadow® solution that has totally gelled up.

It was found in this study that the BTA containing sample was of higher dispersion quality (Q=10) than the others. In the other three, colloidal particle motion stopped very quickly, which is a sign of colloid degradation.

The study shows that BTA helped stop copper corrosion in Shadow® graphite baths which in turn kept the dispersion quality from degrading (copper causes gelling which has been linked to a degradation in backlights). The Butoxyne® 497 did not work for this purpose.

EXAMPLE 6

Comparison of a BTA Bath Line with a Non-BTA Bath (Control) Line

Two 1 liter Shadow® lines were run in this study. Each line comprised a Shadow® graphite bath and a CCIII® bath. The first line had 500 ppm BTA in both the CCIII® bath and the Shadow® graphite bath. The second line was a control.

The BTA solution added to the CCIII® bath contained 25 g/L BTA (0.2083 M) and 13 g/L MEA (0.21 M). 2% by volume of this solution was added to the CCIII® bath, which increased the MEA concentration in the CCIII® bath by 0.26 g/L. The BTA solution used for the Shadow® graphite bath was 25 g/L BTA (0.2083 M) with 0.21 M $(NH_4)OH$. 2% by volume of this solution was added to the Shadow® graphite bath, which increased the ammonia in the Shadow® bath by 0.004 M.

The results showed that BTA was very effective at a 500 ppm level for keeping copper out of both the CCIII® and the Shadow® graphite baths. The BTA bath line out-performed the non-BTA bath line in both dispersion quality and backlights.

EXAMPLE 7

Using BTA to Reverse a Gelled Shadow® Graphite Bath and Improve Coverage on Micro-vias and Blow Hole Coupons A gelled Shadow® graphite dispersion sample containing 550 ppm Cu was taken from the pilot line (the dispersion was exposed to copper containing circuit boards for 48 hours before BTA was added). 400 ppm BTA was added to the pilot sample and 300 ppm and 500 ppm of BTA were added to other gelled shadow samples. There were total 6 samples as follows:
1. 0 ppm BTA was added.
2. 300 ppm BTA was added.
3. 500 ppm BTA was added.
4. 300 ppm BTA was added.
5. 500 ppm BTA was added.
6. Pilot: 400 ppm BTA was added.

The samples were used to apply a graphite coating to coupons. Full analyses were performed for all the samples, and the tests were done in 500 mL beakers in the lab. The method used to determine the dispersion quality (Q) of the samples was the same as that described in Example 5. The samples were first analyzed shortly after BTA was added, and the results are shown in the following table:

| Samples | Conductivity (mS/cm) | pH | Viscosity (CPS) | Backlight (30X) | Particle size (P50 & P95) (μm) | Q (Glass Dispersion) |
|---|---|---|---|---|---|---|
| 0 ppm BTA | 1.56 | 9.14 | 14.5 | 8.7 | 0.833–4.151 | 4 |
| 300 ppm BTA | 1.77 | 9.31 | 4.3 | 9.5 | 0.684–3.828 | 10 |
| 500 ppm BTA | 1.87 | 9.35 | 3.6 | 9.7 | 0.573–3.479 | 10 |
| 300 ppm BTA | 1.74 | 9.31 | 4.7 | 9.5 | 0.724–3.625 | 10 |
| 500 ppm BTA | 1.85 | 9.35 | 3.8 | 9.5 | 0.630–3.674 | 10 |
| Pilot | 1.81 | 9.22 | 4.2 | 9.2 | 0.494–3.172 | 10 |

The bath samples then were allowed to stand for six days and retested to see if BTA was still effective. The following table shows the new test results:

| Samples | Conductivity (mS/cm) | pH | Viscosity (CPS) | Backlight (30X) | Particle size (P50 & P95) (μm) | Q (Glass Dispersion) |
|---|---|---|---|---|---|---|
| 0 ppm BTA | 1.58 | 9.0 | 10.8 | 9.0 | 1.778–5.016 | 4 |
| 300 ppm BTA | 1.73 | 9.12 | 3.6 | 9.0 | 0.913–4.131 | 10 |
| 500 ppm BTA | 1.83 | 9.15 | 3.3 | 8.8 | 0.741–3.882 | 10 |
| 300 ppm BTA | 1.72 | 9.13 | 5.2 | 9.0 | 0.911–4.046 | 10 |

-continued

| Samples | Conductivity (mS/cm) | pH | Viscosity (CPS) | Backlight (30X) | Particle size (P50 & P95) (μm) | Q (Glass Dispersion) |
|---|---|---|---|---|---|---|
| 500 ppm BTA | 1.82 | 9.14 | 2.8 | 9.0 | 0.741–3.981 | 10 |
| Pilot | 1.80 | 9.03 | 3.7 | 9.0 | 0.881–5.637 | 8.5 |

Salt tests were also done for all samples, which measure viscosity of the samples after salt was added. The lower the number, the better the solution is. And the results of the tests are shown as follows:

| Samples | 0 g NaCl | 0.6 g NaCl | 1.2 g NaCl | 1.8 g NaCl | 2.4 g NaCl |
|---|---|---|---|---|---|
| 0 ppm BTA | 10.8 | 32.4 | 33.7 | 35.6 | 39.5 |
| 300 ppm BTA | 3.6 | 20.4 | 24.1 | 25.8 | 26.4 |
| 500 ppm BTA | 3.3 | 17.3 | 22 | 23.6 | 24.6 |
| 300 ppm BTA | 5.2 | 22.4 | 25 | 26.9 | 27.1 |
| 500 ppm BTA | 2.8 | 19.1 | 21.7 | 23.8 | 24.6 |
| Pilot | 3.7 | 20.8 | 24.3 | 23.8 | 24.1 |

The results showed that, when present at 300 ppm or more, BTA completely reversed the gel formation in the samples and also improved their dispersion qualities and the backlights when the samples were used to conductively coat a through hole. The backlights definitely were better shortly after BTA was added. Even after allowing the BTA-modified dispersion to stand for 6 days, the backlight was nearly the same for all samples as when BTA was just added. Particle size and salt test also benefited from BTA addition.

BTA not only helps prevent the copper from being etched by a carbon dispersion but also improves the dispersion even in the presence of copper, and after the bath has gelled up.

What is claimed is:

1. A composition comprising:
   A. from about 0.1 to about 25% by weight of graphite;
   B. from about 0.01 to about 10% by weight of a water dispersible binding agent for binding to said graphite, wherein said water dispersible binding agent is selected from the group consisting of monosaccharides, polysaccharide, and combinations thereof; and
   C. a corrosion inhibitor, wherein said corrosion inhibitor is present in an amount effective to reduce the dissolution of metal from a metallic surface in contact with said composition, wherein said graphite and corrosion inhibitor are dispersed in water.

2. The composition of claim 1, further comprising carbon black.

3. The composition of claim 1 wherein said corrosion inhibitor is present in an amount effective to prevent the dissolution of metal from said metallic surface in contact with said composition.

4. The composition of claim 1 wherein said amount of said corrosion inhibitor is from about 1 ppm to about 1% by weight.

5. The composition of claim 1 wherein said amount of said corrosion inhibitor is from about 50 ppm to about 4000 ppm.

6. The composition of claim 1 wherein said amount of said corrosion inhibitor is from about 200 ppm to about 600 ppm.

7. The composition of claim 1 wherein said corrosion inhibitor is at least one of an imidazole, a triazole, an indole, an azole, a thiazole, or a tetrazole.

8. The composition of claim 1 wherein said corrosion inhibitor is benzotriazole or tolyltriazole.

9. The composition of claim 1 wherein said metal is copper.

* * * * *